United States Patent
Brown et al.

(10) Patent No.: US 8,791,357 B2
(45) Date of Patent: Jul. 29, 2014

(54) MICRO-GAP THERMAL PHOTOVOLTAIC LARGE SCALE SUB-MICRON GAP METHOD AND APPARATUS

(75) Inventors: Eric L. Brown, Cambridge, MA (US); Robert S. DiMatteo, Cambridge, MA (US); Bruno A. Nardelli, Watertown, MA (US); Bin Peng, Wuhan (CN); Xiao Li, Wuhan (CN)

(73) Assignee: MTPV Power Corporation, Austin, TX (US)

( * ) Notice: Subject to any disclaimer, the term of this patent is extended or adjusted under 35 U.S.C. 154(b) by 467 days.

(21) Appl. No.: 13/037,214

(22) Filed: Feb. 28, 2011

(65) Prior Publication Data

US 2011/0315195 A1  Dec. 29, 2011

Related U.S. Application Data

(60) Provisional application No. 61/308,972, filed on Feb. 28, 2010.

(51) Int. Cl.
  *H01L 31/00* (2006.01)
  *H01L 31/04* (2014.01)
  *H01L 31/024* (2014.01)

(52) U.S. Cl.
  CPC .......... *H01L 31/0406* (2013.01); *H01L 31/024* (2013.01)
  USPC ............................ 136/253; 136/200; 136/201

(58) Field of Classification Search
  CPC ........................... H01L 31/024; H01L 31/0406
  USPC ................... 136/253, 244, 200, 201
  See application file for complete search history.

(56) References Cited

U.S. PATENT DOCUMENTS

| | | | |
|---|---|---|---|
| 4,561,040 A * | 12/1985 | Eastman et al. | 361/699 |
| 5,593,509 A | 1/1997 | Zuppero et al. | |
| 6,232,456 B1 * | 5/2001 | Cohen et al. | 536/23.2 |
| 6,232,546 B1 | 5/2001 | DiMatteo et al. | |
| 7,390,962 B2 * | 6/2008 | Greiff et al. | 136/253 |
| 7,755,184 B2 * | 7/2010 | Macris et al. | 257/706 |
| 2004/0052998 A1 * | 3/2004 | Freuler et al. | 428/40.1 |
| 2004/0231717 A1 | 11/2004 | Greiff et al. | |
| 2005/0109386 A1 | 5/2005 | Marshall | |
| 2005/0196321 A1 * | 9/2005 | Huang | 422/68.1 |
| 2008/0223435 A1 * | 9/2008 | Greiff et al. | 136/252 |
| 2009/0014056 A1 | 1/2009 | Hockaday | |
| 2009/0277488 A1 * | 11/2009 | Greiff et al. | 136/200 |

* cited by examiner

*Primary Examiner* — Devina Pillay

(74) *Attorney, Agent, or Firm* — Taylor Russell & Russell, P.C.

(57) ABSTRACT

The present invention relates to micron-gap thermal photovoltaic (MTPV) technology for the solid-state conversion of heat to electricity. The problem is forming and then maintaining the close spacing between two bodies at a sub-micron gap in order to maintain enhanced performance. While it is possible to obtain the sub-micron gap spacing, the thermal effects on the hot and cold surfaces induce cupping, warping, or deformation of the elements resulting in variations in gap spacing thereby resulting in uncontrollable variances in the power output. A major aspect of the design is to allow for intimate contact of the emitter chips to the shell inside surface, so that there is good heat transfer. The photovoltaic cells are pushed outward against the emitter chips in order to press them against the inner wall. A high temperature thermal interface material improves the heat transfer between the shell inner surface and the emitter chip.

19 Claims, 13 Drawing Sheets

MICRO-GAP THERMAL PHOTOVOLTAIC LARGE SCALE SUB-MICRON GAP METHOD AND APPARATUS

This application claims benefit of U.S. Provisional Application No. 61/308,972 filed on Feb. 28, 2010, and is incorporated herein by reference.

FIELD OF THE INVENTION

The present invention relates to micron-gap thermal photovoltaic (MTPV) technology for the solid-state conversion of heat to electricity. More broadly, the invention generates electrical power when it is inserted into a high temperature environment such as an industrial melting furnace.

BACKGROUND OF THE INVENTION

Thermo photovoltaic devices (TPV) consist of a heated black-body which radiates electromagnetic energy across a gap onto a photovoltaic device which converts radiant power into electrical power. The amount of power out of a given TPV device area is constrained by the temperature of the hot side of the device and generally requires very high temperatures, creating barriers to it practical use. By contrast, micron gap thermal photovoltaic (MTPV) systems allow the transfer of more power between the power emitter and receiver by reducing the size of the gap between them. By employing submicron gap technology, the achievable power density for MTPV devices can be increased by approximately an order of magnitude as compared to conventional TPV. Equivalently, for a given active area and power density, the temperature on the hot-side of an MTPV device can be reduced. This allows for new applications for on chip power, waste heat power generation and converter power.

It has been shown that electromagnetic energy transfer between a hot and cold body is a function of the close spacing of the bodies due to evanescent coupling of near fields. Thus, the closer the bodies, approximately one micron and below, the greater the power transfer. For gap spacings of 0.1 microns, increases in the rate of energy transfer of factors of five and higher are observed.

The dilemma, however, is forming and then maintaining the close spacing between two bodies at a sub-micron gap in order to maintain enhanced performance. While it is possible to obtain the sub-micron gap spacing, the thermal effects on the hot and cold surfaces induce cupping, warping, or deformation of the elements resulting in variations in gap spacing thereby resulting in uncontrollable variances in the power output.

Typically, in order to increase power output, given the lower power density of prior art devices, it has been necessary to increase the temperature. Temperature increases, however, are limited by the material of the device and system components.

Micron gap thermal photovoltaic (MTPV) systems are a potentially more efficient way to use photovoltaic cells to convert heat to electricity. Micron gap thermal photovoltaic devices are an improved method of thermal photovoltaics which is the thermal version of "solar cell" technology. Both methods make use of the ability of photons to excite electrons across the bandgap of a semi-conductor and thereby generate useful electric current. The lower the temperature of the heat source, the narrower the bandgap of the semi-conductor must be to provide the best match with the incoming spectrum of photon energy. Only those photons with energy equal to or greater than the bandgap can generate electricity. Lower energy photons can only generate heat and are a loss mechanism for efficiency. A preferred micron gap thermal photovoltaic system would include a source of heat radiated or conducted to an emitter layer which is suspended at a submicron gap above the surface of an infrared sensing photovoltaic cell.

By using a sub-micron gap between a hot emitting surface and a photovoltaic collector, a more enhanced rate of transfer of photons from solid to solid is observed than is possible with large gaps. Additional transfer mechanisms are involved other than simply Planck's law of the radiation, although the spectral distribution of the photons is that of a black body. The use of sub-micron gaps, however, implies that a vacuum environment is used to avoid excessive heat conduction across the gap by low energy photons that cannot excite electrons into the conduction hand. To make efficient use of the source of heat, a high fraction of high energy photons must be generated. The structure used to separate the emitting surface from the photovoltaic cell must be both small in diameter and also a very good thermal insulator for the same efficiency considerations. The photovoltaic cell will generally have to be cooled somewhat so that it will function properly. At high temperatures, intrinsic carrier generation swamps the PN junction and it is no longer an effective collector of electrons.

Micron gap thermal photovoltaic systems function as though the emitter has an emissivity value greater than one. The definition of a black body is that it has an emissivity value equal to one and this value cannot be exceeded for large gap radiant energy transfer. Equivalent emissivity factors of 5-10 have been experimentally demonstrated using gaps in the region of 0.30 to 0.10 microns.

There are at least two ways to take advantage of this phenomenon. In a comparable system, if the temperature of the emitting surfaces is kept the same, the micron gap thermal photovoltaic system can be made proportionately smaller and cheaper while producing the same amount of electricity. Or, if a comparable size system is used, the micron gap thermal photovoltaic system will run at a considerably lower temperature thereby reducing the cost of materials used in manufacturing the system. In a preliminary estimate, it was calculated that by using micron gap technology the operating temperature of a typical system could be reduced from 1,400° C. to 1,000° C. and still produce the same output of electricity. Such a lowering of temperature could make the difference in the practicality of the system due to the wider availability and lower cost of possible materials.

U.S. Pat. Nos. 7,390,962, 6,232,546 and 6,084,173 and U.S. patent application Ser. Nos. 12/154,120, 11/500,062, 10/895,762, 12/011,677, 12/152,196 and 12/152,195 are incorporated reference herein.

Additional energy transfer mechanisms have been postulated and the ability to build systems using narrow thermally isolated gaps may find use in many types of applications in accordance with the subject invention.

SUMMARY OF INVENTION

It is therefore an object of this invention to provide a novel micron gap thermal photovoltaic device structure which is also easier to manufacture.

It is a further object of this invention to provide such a micron gap thermal photovoltaic device which results in high thermal isolation between the emitter and the photovoltaic substrate.

It is a further object of this invention to provide such a micron gap thermal photovoltaic device which can have a large area and is capable of high yield.

It is a further object of this invention to provide such a micron gap thermal photovoltaic device which allows for lateral thermal expansion.

It is a further object of this invention to provide such a micron gap thermal photovoltaic device which is efficient.

It is a further object of this invention to provide such a micron gap thermal photovoltaic device with a uniform sub-micron gap.

It is a further object of this invention to provide such a micron gap thermal photovoltaic device which provides greater energy transfer.

It is a further object of this invention to provide such a micron gap thermal photovoltaic device which is constructed without assembling multiple discrete pieces.

It is a further object of this invention to provide a method of making a micro gap photovoltaic device.

It is a further object of this invention to provide a micron gap device useful as a thermal photovoltaic system and also useful in other applications.

The thermo photovoltaic system and apparatus generates electrical power when it is inserted into a high temperature environment, such as an industrial melting furnace. It consists of a heat and corrosion resistant, vacuum-tight shell, and a liquid-cooled mechanical assembly inside that makes contact with the inside walls of the heated shell.

The mechanical assembly facilitates and provides a means for achieving sub-micron spacing between large emitter and photovoltaic surfaces. Heat is conducted from the inner surface of the shell to a spectrally controlled radiator surface (hot side). The radiator surface emits the heat in the form of electromagnetic energy, across a sub-micron gap to a photovoltaic (PV) device (cold side). A portion of the heat is converted to electricity by the photovoltaic cell. The rest of the thermal energy is removed from the opposite side of the photovoltaic cell by a liquid cooled, pinned or finned, heat sink.

A major aspect of the design is to allow for intimate contact of the emitter chips to the shell inside surface, so that there is good heat transfer. The photovoltaic cells are pushed outward against the emitter chips in order to press them against the inner wall. A high temperature thermal interface material improves the heat transfer between the shell inner surface and the emitter chip. Tiny spacers on the emitter chips always maintain a sub-micron gap between the hot radiating surface and the photovoltaic cells.

The mechanical assembly is designed to push the hot and cold chips against the shell inside surface as the shell heats up, expands, and warps. To achieve this, the photovoltaic cells are attached to a deformable body that is able to conform to the shape of the inside surface of the shell. The deformable body is a thin metal foil (membrane). Pressure is imparted to the membrane by means of a pneumatic diaphragm and a liquid metal filled cavity.

The liquid metal cavity serves two purposes: 1) to impart pressure to the back side of the membrane, which in turn pushes the photovoltaic chips against the emitter chips, while allowing the membrane to flex and conform to the shape of the shell inside surface; and 2) to carry excess heat away from the photovoltaic to a liquid cooled heat sink.

The empty space inside the shell is a nearly perfect vacuum ($<10^{-3}$ Torr), so that heat is not conducted by air across the sub-micron gap and between exposed shell inside surfaces and the heat sink.

This invention is useful because it generates electrical power from heat that otherwise would be wasted. The electricity can be used to power other devices within the plant, or it can be sold to the utility company.

The invention disclosed herein is, of course, susceptible of embodiment in many different forms. Shown in the drawings and described herein below in detail are preferred embodiments of the invention. It is to be understood, however, that the present disclosure is an exemplification of the principles of the invention and does not limit the invention to the illustrated embodiments.

BRIEF DESCRIPTION OF DRAWINGS

For a further understanding of the nature and objects of the present invention, reference should be made to the following detailed description, taken in conjunction with the accompanying drawings, in which like elements are given the same or analogous reference numbers and wherein.

DETAILED DESCRIPTION OF INVENTION

Figure 1:
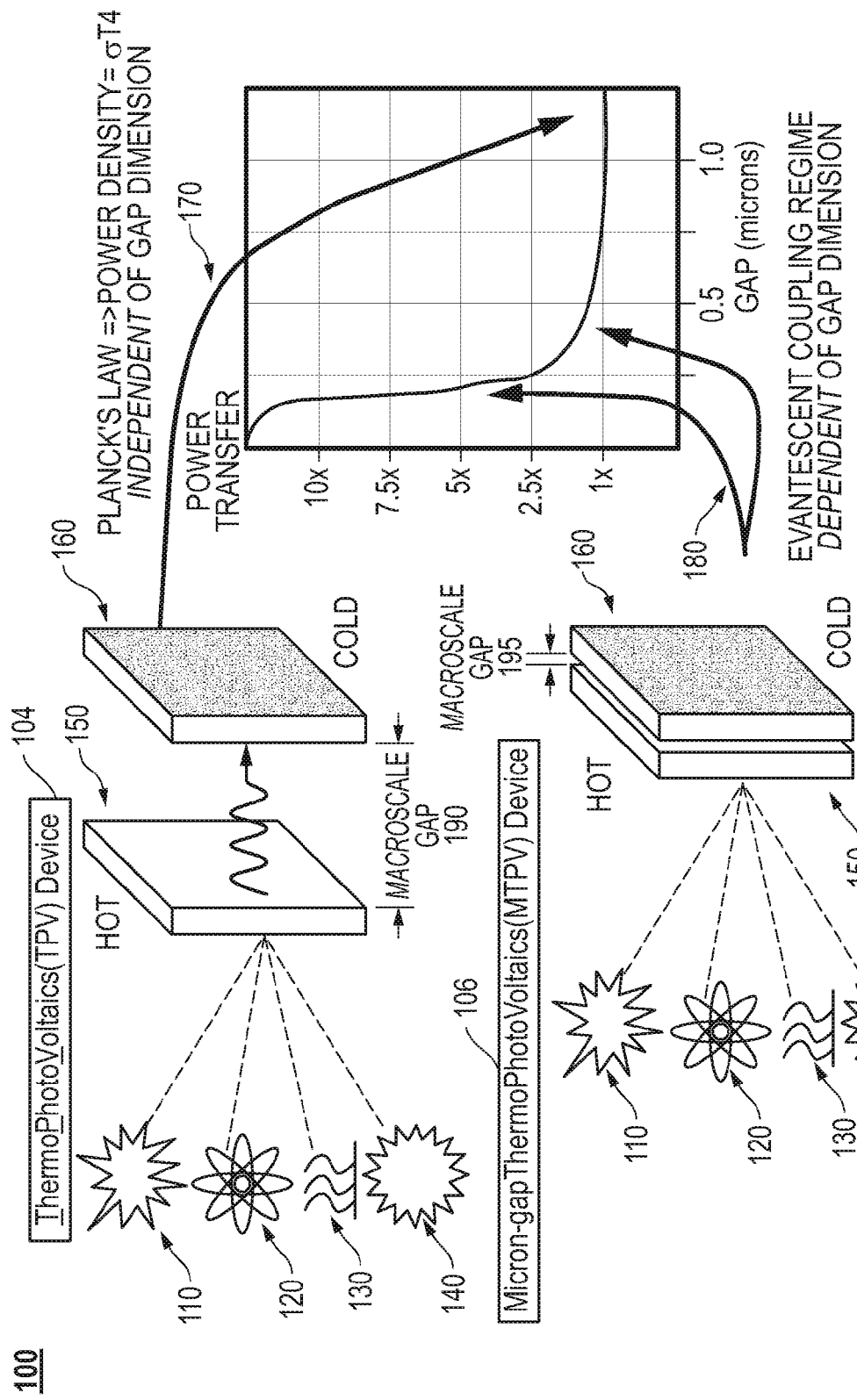
FIG. 1 illustrates thermo photovoltaic and micron-gap thermo photovoltaic technology in accordance with the present invention.

Turning to FIG. 1, FIG. 1 illustrates thermo photovoltaic 104 and micron-gap thermo photovoltaic 106 technologies in accordance with the present invention. Both technologies may use heat from the combustion of gas, oil or coal 110, nuclear energy 120, waste heat from industrial processes 130 or solar heat 140. Thermo photovoltaic devices (TPV) 104 consist of a heated black-body 150 which radiates electromagnetic energy across a macro scale gap 190 onto a photovoltaic device 160 which converts radiant power into electrical power. The amount of power out of a given TPV device area is constrained by the temperature of the hot side of the device and generally requires very high temperatures, creating barriers to it practical use. By contrast, micro scale gap 195 thermal photovoltaic (MTPV) devices 106 allow the transfer of more power between the power emitter 150 and receiver 160 by reducing the size of the gap 195 between them. By employing submicron gap technology, the achievable power density for MTPV devices 106 can be increased by approximately an order of magnitude as compared to conventional TPV devices 104. Equivalently, for a given active area and power density, the temperature on the hot-side of an MTPV device can be reduced. This allows for new applications for on chip power, waste heat power generation and converter power.

It has been shown that electromagnetic energy transfer between a hot and cold body is a function of the close spacing of the bodies due to evanescent coupling of near fields. Thus, the closer the bodies 170, approximately one micron and below, the greater the power transfer. For gap spacing of 0.1 microns 180, increases in the rate of energy transfer of factors of five and higher are observed. By using a sub-micron gap 195 between a hot emitting surface 150 and a photovoltaic collector 160, a more enhanced rate of transfer of photons from solid to solid is observed than is possible with large gaps 190. Additional transfer mechanisms are involved other than simply Planck's law of the radiation, although the spectral distribution of the photons is that of a black body. The use of sub-micron gaps, however, implies that a vacuum environment is used to avoid excessive heat conduction across the gap by low energy photons that cannot excite electrons into the conduction band. To make efficient use of the source of heat, a high fraction of high energy photons must be generated. The structure used to separate the emitting surface from the photovoltaic cell must be both small in diameter and also a very good thermal insulator for the same efficiency considerations. The photovoltaic cell will generally have to be cooled somewhat so that it will function properly. At high temperatures, intrinsic carrier generation swamps the PN junction and it is no longer an effective collector of electrons.

Figure 2A:
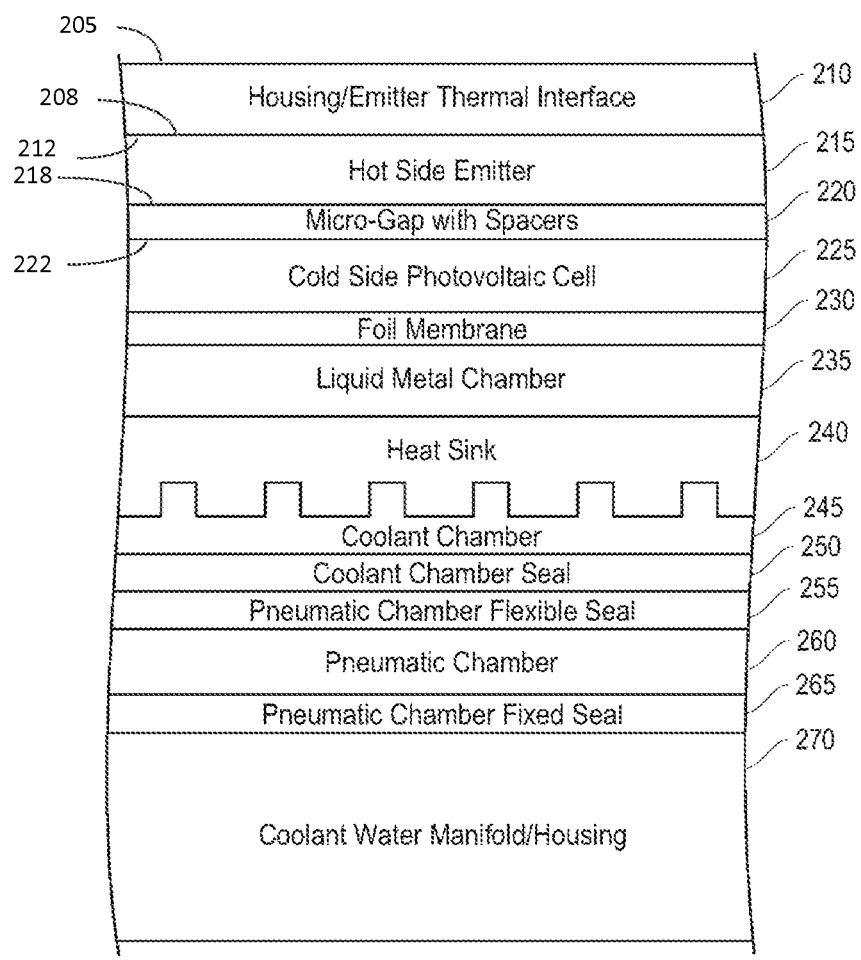
FIG. 2A illustrates an embodiment of a single-sided MTPV device.

Turning to FIG. 2A, FIG. 2A illustrates an embodiment 200 of a single-sided MTPV device. The embodiment includes a thermal interface 210 for conducting heat between housing that is exposed to a high temperature and a hot side emitter 215. The hot side emitter 215 is separated from a cold side photovoltaic cell 225 by a micro-gap that is maintained by spacers 220. A foil membrane 230 is positioned between the cold side photovoltaic 225 and a chamber 235 containing a liquid metal that is maintained under controlled pressure. This pressurized chamber 235 ensures that the hot side emitter 215 and thermal interface 210 is maintained in close contact with the housing over a wide temperature range. Adjacent to the liquid metal chamber 235 is a heat sink 240 that is cooled by a continuous flow of coolant in a coolant chamber 245. The coolant chamber 245 is separated from a pneumatic chamber 260 by a coolant chamber seal 250 and a pneumatic chamber flexible seal 255. The pneumatic chamber 260 is maintained at a controlled pressure to further ensure that close contact is maintained between the heat sink 240, the liquid metal chamber 235, the cold side emitter 225, the hot side emitter 215, the thermal interface 210 and the housing. A pneumatic chamber fixed seal 265 is positioned between the pneumatic chamber 260 and a coolant water manifold 270, which is connected to a continuous supply of circulated cooling water for cooling the heat sink 240.

Figure 2B:
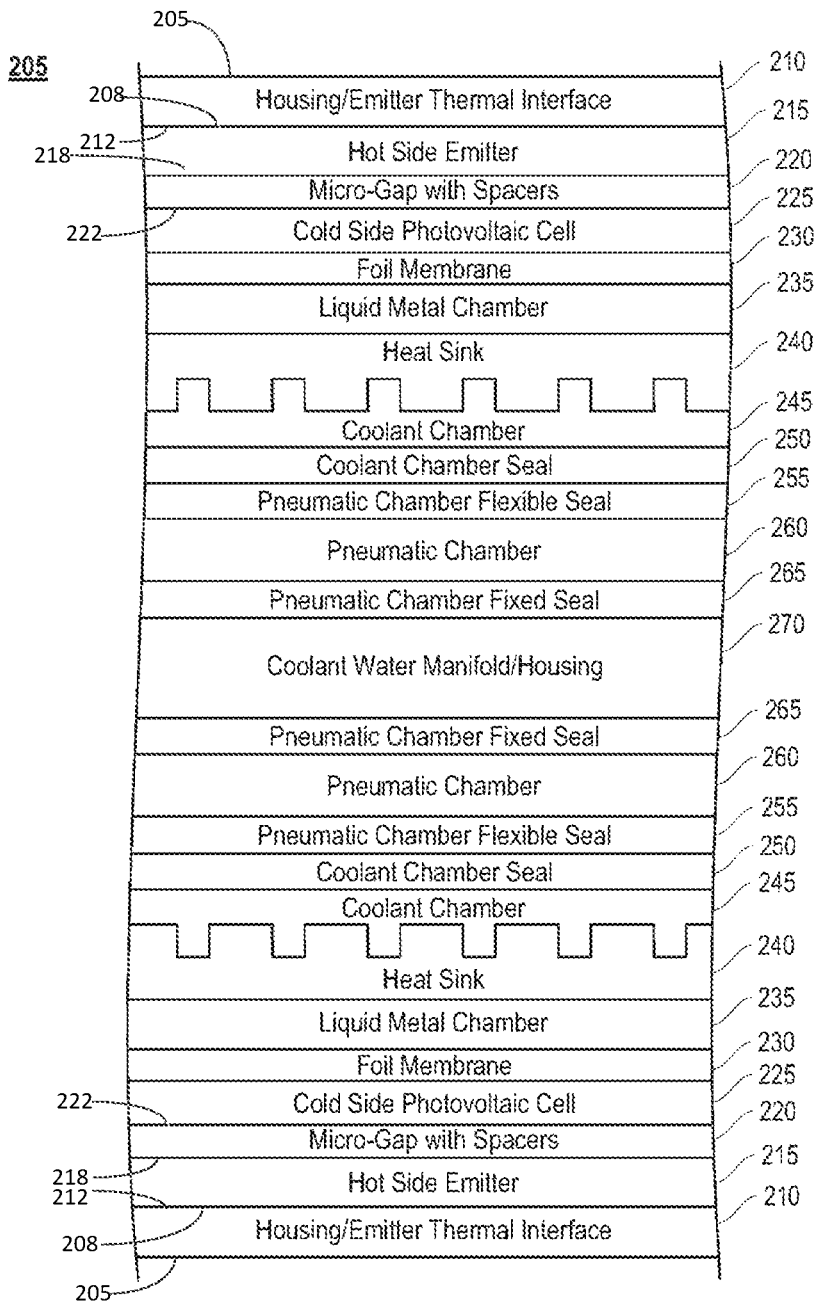
FIG. 2B illustrates an embodiment of a two-sided MTPV device.

Turning to FIG. 2B, FIG. 2B illustrates an embodiment 205 of a two-sided MTPV device. The two-sided MTPV device includes the structure described above in relation to FIG. 2A and an additional structure that is an inverted image of that shown in FIG. 2A attached to the common coolant water manifold 270. This structure enables the collection of heat from both sides of an MTPV device.

Figure 3:
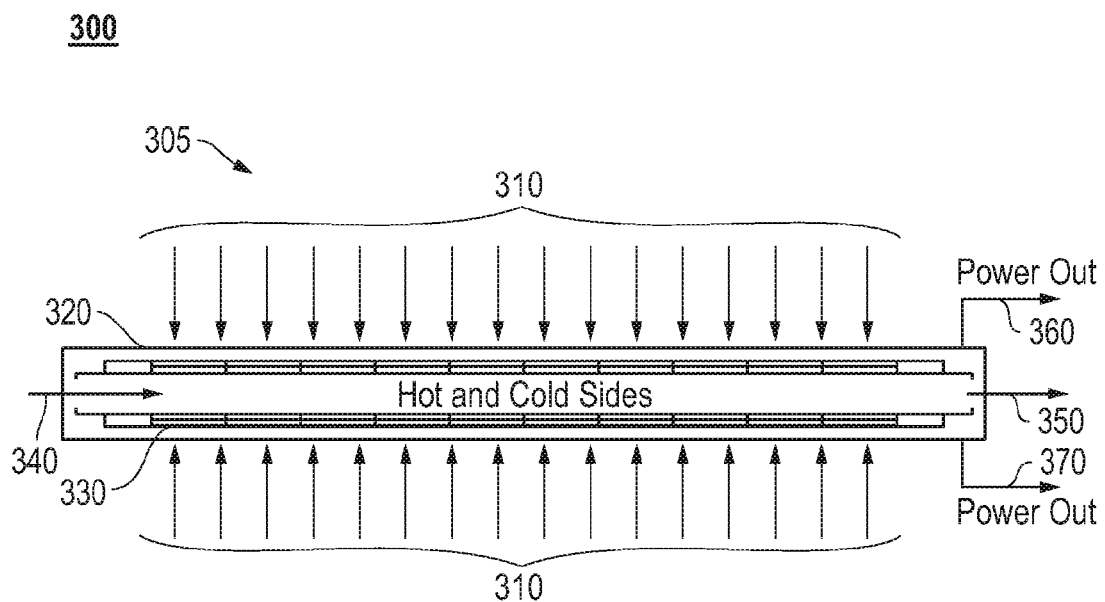
FIG. 3 illustrates an embodiment 300 the operation of the MTPV device.

Turning to FIG. 3, FIG. 3 illustrates an embodiment 300 that shows the operation of the MTPV device. The MTPV device 305 is exposed to radiant and convective heat flux 310, which heats the outer surface and the hot side of the hot side/cold side pair 320, 330. A vacuum is maintained in the interior of the MTPV device 305 and the cold side photovoltaic cell is cooled from the inside by circulating water 340, 350. Output power 360, 370 is obtained from the device 305.

Figure 4:
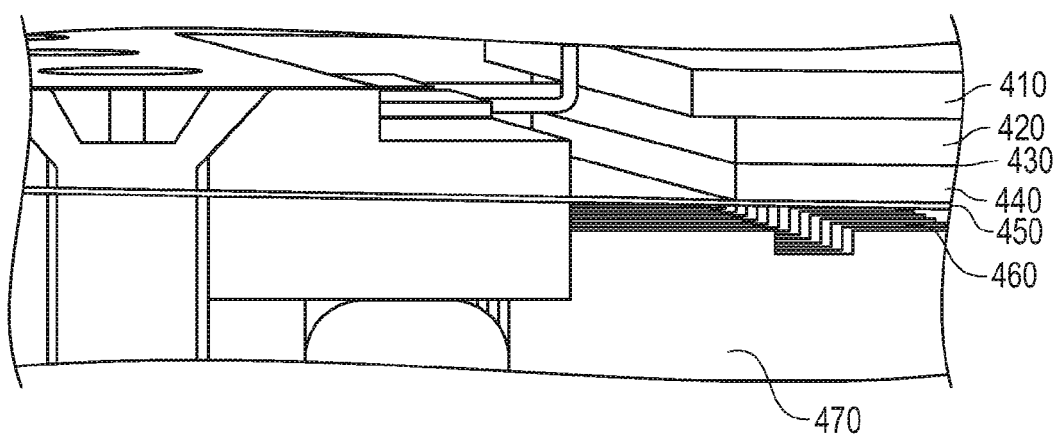
FIG. 4 illustrates a practical embodiment 400 of a cross sectional view of a front end of a quad MTPV device.

Turning to FIG. 4, FIG. 4 illustrates a practical embodiment 400 of a cross sectional view of a front end of a quad MTPV device. The quad MTPV device is a basic building block for implementing the MTPV technology. The front end includes a thermally conductive graphite interface 410 between a high temperature housing and a hot side emitter 420. A micro-gap 430 is maintained between the hot side emitter 420 and a cold side photovoltaic cell 440. A foil membrane 450 is positioned between the cold side emitter 440 and a liquid metal chamber 460. A surface of a heat sink 470 and the foil membrane 450 enclose the liquid metal chamber 460.

The purpose of the emitters 420 is to absorb heat from the inside of the housing of the quad MTPV device. An emitter chip 420 is typically, but not necessarily, made of silicon and has micro-machined silicon dioxide spacers on the gap side. The smooth side of the emitter 420 is pressed against the inside of the hot housing. A graphite thermal interface material 410 is sandwiched between the emitter 420 and the housing to improve heat transfer. The housing is heated by the radiant and convective energy within a furnace and the heat is conducted through the housing, across a thermal interface material 410 and into the silicon emitter 420, causing it to become very hot.

The photovoltaic cells 440 are designed to convert some of the light emitted from a hot body into electricity. More specifically, the photovoltaic cells 440 have a very flat surface so that when they are pressed against the spacers on the emitting surface 420, a very small vacuum gap is formed. The spacers are designed so that very little heat flow is conducted from the hot emitter 420 to the relatively cool photovoltaic cell 440. The photovoltaic cell 440 and emitter 420 are also made of high index materials to obtain a maximum amount of near-field coupled energy enhancement. A percentage of the light passing from the emitters 420 to the photovoltaic cells 440 is converted to electricity.

Figure 5:
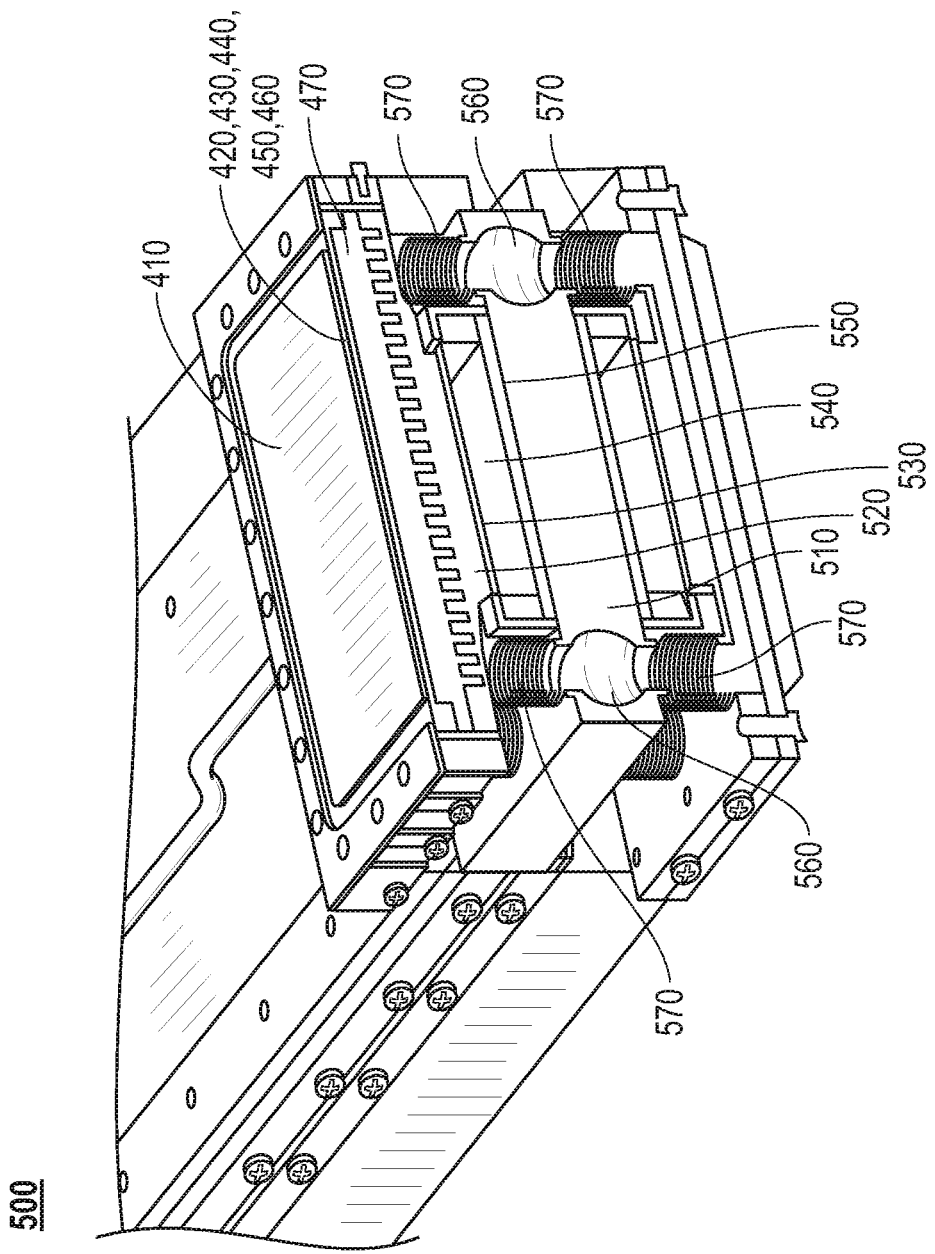
FIG. 5 is a cross sectional view 500 of a quad module.

Turning to FIG. 5, FIG. 5 is a cross sectional view 500 of a quad module. This view is a macroscopic perspective that includes the elements shown in FIG. 4. The quad module includes a water distribution housing, also known as a coolant water manifold 510, a bellow subassembly 560, 570, a heat sink subassembly 470, a pneumatic subassembly 530, 540, 550, a liquid metal compartment 460 (see also FIG. 4), a membrane and photovoltaic subassembly 440, 450 (see also FIG. 4), hot side emitter array 410, 420 (see also FIG. 4), and a linear actuator pressure regulator (inside the water distribution housing). These elements form the basic quad module building block. One or more quad modules are normally enclosed in an evacuated enclosure or hot housing that is exposed to high temperatures for generating electrical power.

The membrane 450, liquid metal 460, heat sink 470, and bellows subassemblies 570 have very coupled functionality. The metal bellows 570 transfer water between the water distribution housing 510 and the heat sink 470, one set of bellows 570 on the inlet side and the other set on the outlet side. The bellows 570 also act as expansion joints, so that when the housing heats up and expands, the bellows 570 elongate. The bellows 570 are always compressed so that they provide a force that pushes the heat sink and membrane assemblies toward the hot cover, thus pushing the photovoltaic cells 440 against the emitter spacers and pushing the emitter 420 against the hot wall. While the heat sink 470 has internal voids for water to pass through, it also acts as a suspended platform for the photovoltaic cells. Through flexing of the bellows 570, the platform can move in and out and tilt about two axes. This articulation allows the photovoltaic array 420 to conform, macroscopically, to the orientation of the hot housing. The flexible membrane 450 is there to deal with curvature of the hot housing.

The membrane 450 is a second suspension for the chips. The first suspension takes care of rigid body motions due to thermal expansion and tilt offsets due to machining tolerances and differential heating. The membrane 450 is a flexible suspension for the photovoltaic cells 440, allowing the array of cells to push against the emitters 420 and bend and flex such that the chips conform to the curved shape of the housing. It is important to note that when heat flows normal to a flat plate, there is a temperature drop across the plate which causes thermal bending, or bow. The photovoltaic cells 440 are bonded to membrane 450. The metal membrane 450 has an insulating layer and a patterned layer of electrical conductors. In this sense, the membrane 450 acts as a printed circuit board, tying the photovoltaic cells 440 together in series and/or parallel and carrying the electricity to the edge of the membrane 450.

The membrane 450 is sealed around the edges to the platform, leaving a small gap between the membrane 450 and the platform. This space is then filled with liquid metal. The liquid metal serves two purposes. First, it provides a thermal path between the photovoltaic cells 440 and the heat sink 470. Second, because it is a fluid, it allows the membrane 450 to flex.

The hot housing is made from a high temperature metal and is securely closed after the quad modules are placed inside. The size of the housing depends on the number and distribution of quad modules. The inside surfaces are polished so that they have a low emissivity. The outside surfaces are intentionally oxidized to a black finish so that they will absorb more radiant heat from the furnace. The housing has pass-through ports for cooling fluid, vacuum pumping, and electrical wires.

The pneumatic subassembly 530, 540, 550 sits between the water distribution housing 510 and the heat sink 470. In parallel with the bellows 570, the pneumatic diaphragm 530 pushes the heat sink 470 outward toward the hot housing, thus squeezing the photovoltaic cells 440 and emitters 420 between the membrane 450 and the hot housing. With the proper amount of pneumatic force and pressure in the liquid metal cavity, the membrane 450, chips, and housing will all take on the same shape and the gap between the emitter 420 and photovoltaic cells 440 will be uniform (but not necessarily flat).

The heat flows into the housing, through the thermal interface material 410, and into the emitter 420. It is then radiated across a sub-micron vacuum gap to the photovoltaic cell 440, where some of the energy is converted to electricity and taken away by the metallization on the membrane surface. The rest of the heat passes through the membrane 450, liquid metal, copper, copper pins, and into the cooling water, which is constantly being replenished.

If the photovoltaic cells 440 are all put in series, then bypass diodes can be connected at the ends of each row of cells, such that, if a photovoltaic cell 440 within a row were to fail, the entire row can be bypassed, and the electrical current will be passed to the next row.

Figure 6:
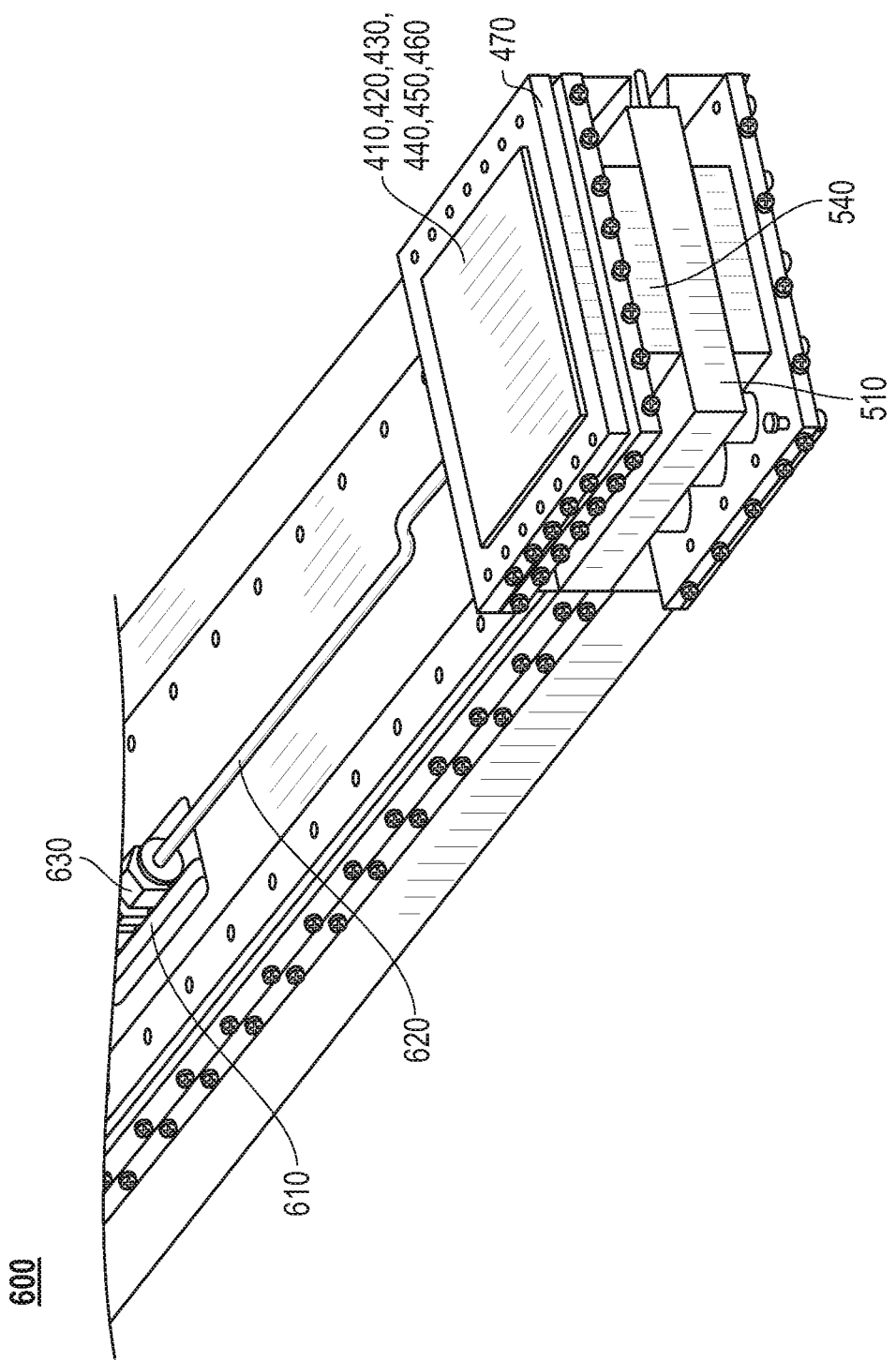
FIG. 6 illustrates a complete quad module mounted on the end of its assembly.

Turning to FIG. 6, FIG. 6 illustrates a complete quad module 600 mounted on the end of its assembly. Shown in FIG. 6 is a hot side emitter array 410, 420, membrane and photovoltaic assembly 440, 450, liquid metal chamber 460, heat sink 470, water distribution housing 510, pneumatic chamber 540, electrical connections 610 and pneumatic connections 620, 630.

The linear actuator consists of a motor and lead screw and is housed inside of the water distribution housing 510. Its purpose is to control the amount of liquid that is behind the membrane 450. The actuator drives a piston, which is attached to a rolling diaphragm. The interior of the diaphragm is filled with liquid metal, which can be pumped through channels that lead to the liquid metal/membrane chamber 460. To increase or decrease the amount of liquid metal behind the membrane 450, the actuator is driven outward or inward, respectively. The actuator also is used to control the pressure in the liquid metal. Between the linear actuator and the piston is a die spring. Force from the actuator goes through the spring and into the piston, so that the spring is always in compression. This allows for the actuator to modify the liquid metal pressure, even if the piston remains stationary. Compression of the die spring is directly related to the liquid metal pressure.

Figure 7:
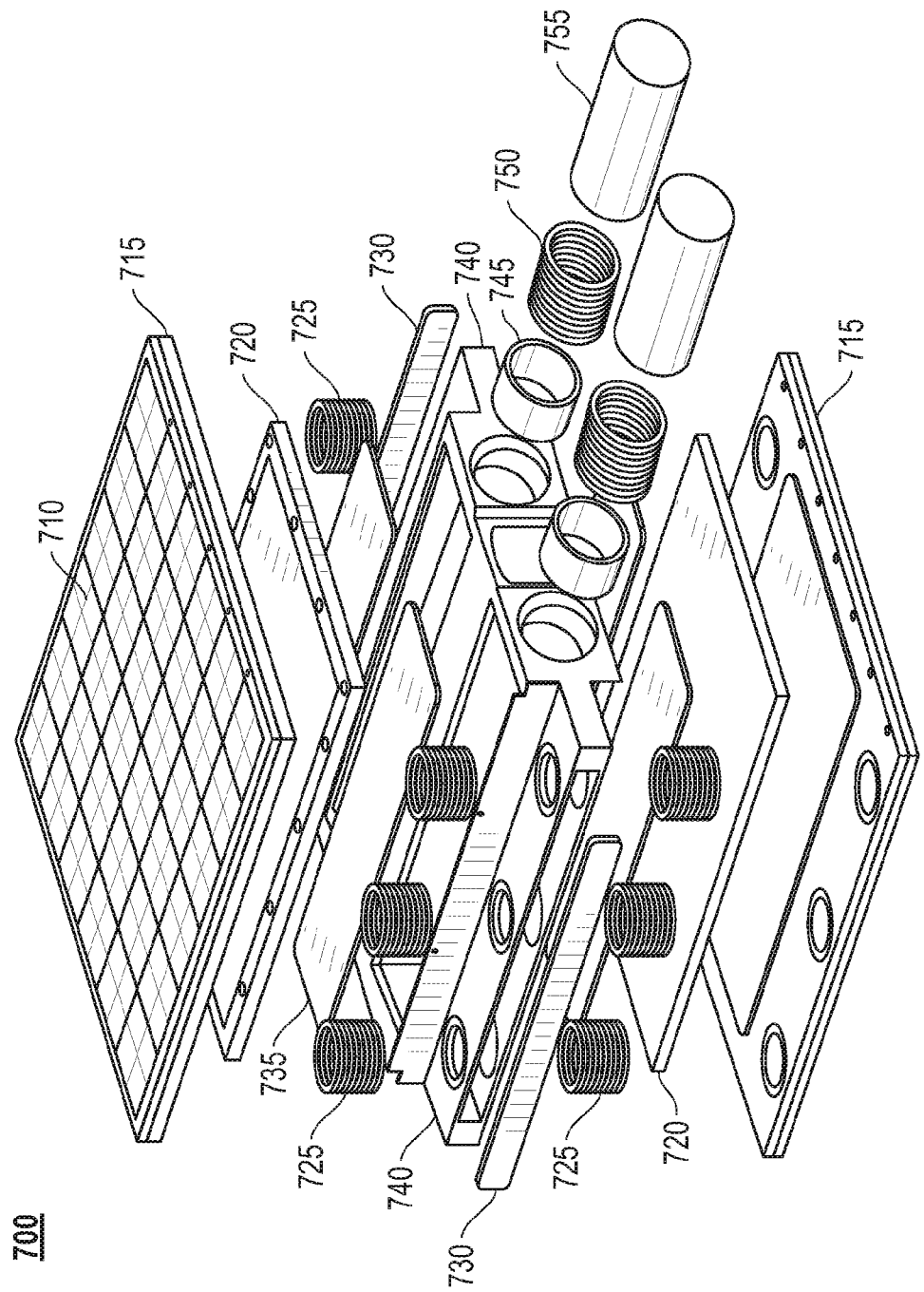
FIG. 7 illustrates the various parts that are assembled to form a quad module.

Turning to FIG. 7, FIG. 7 illustrates the various parts that are assembled to form a quad module 700. These include a photovoltaic array 710 and heat sink top 715, heat sink bottom 720, water housing top cover 735, servometer bellows 725, water housing side covers 730, water housing 740, bellows connectors 745, servometer bellows 750, and bellows tubes 755.

Figure 8:
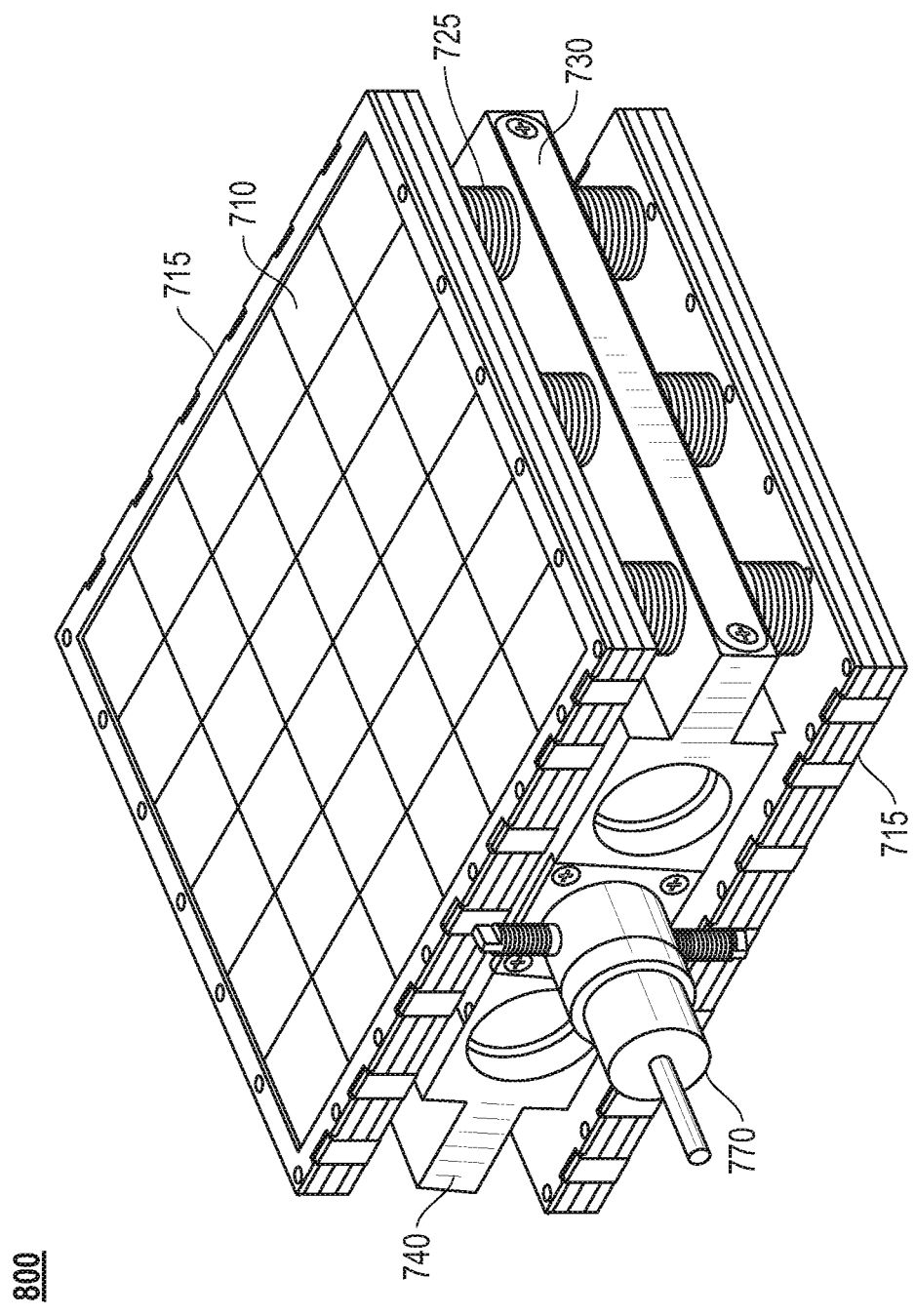
FIG. 8 illustrates a completely assembled quad module.

Turning to FIG. 8, FIG. 8 illustrates a completely assembled quad module 800. As shown in FIG. 8, a quad module includes a photovoltaic array 710 and heat sink top 715, servometer bellows 725, water housing side covers 730, water housing 740, and electrical and pneumatic connections 770 to external control modules.

Figure 9:
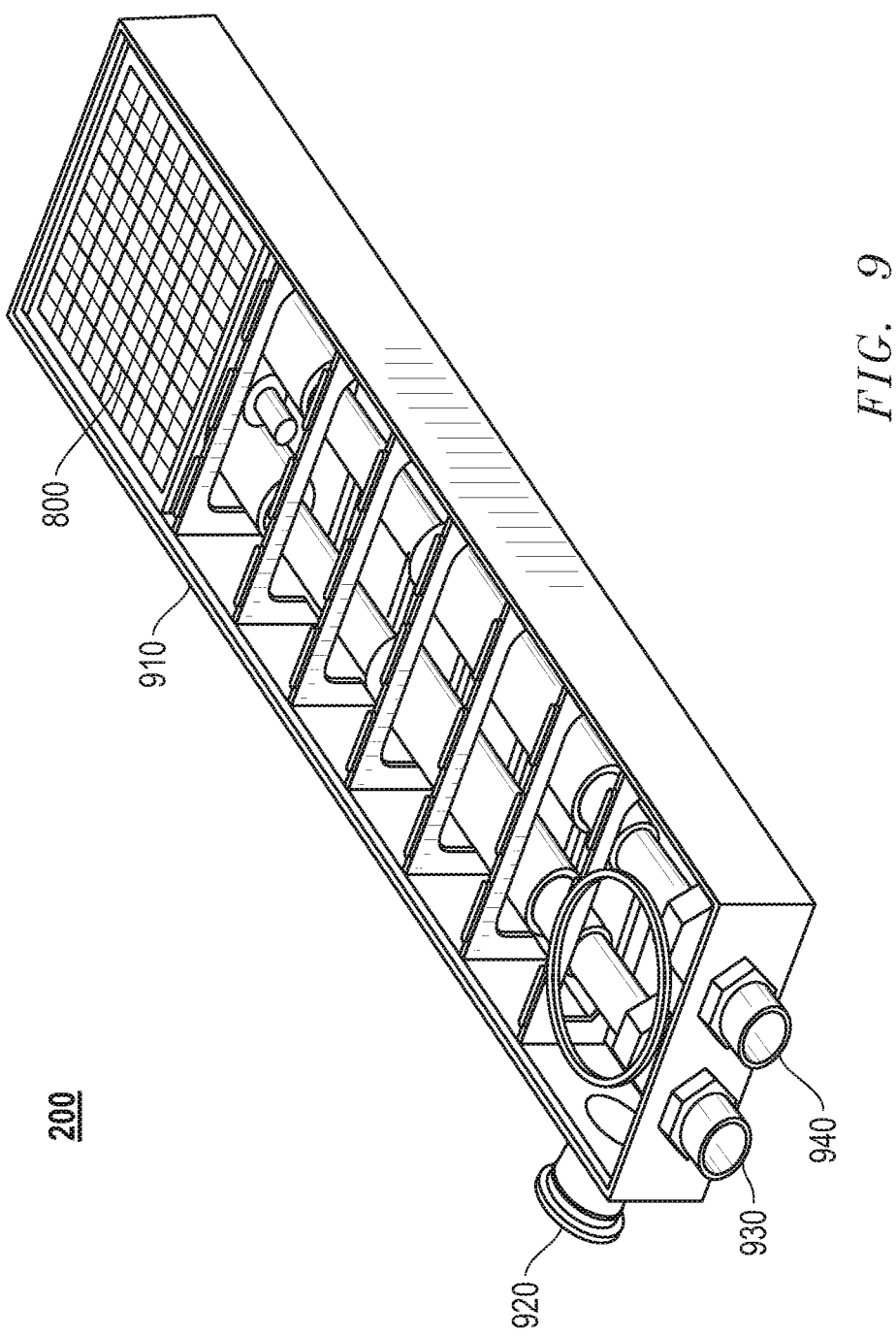
FIG. 9 illustrates a single quad module within its housing with its top cover removed.

Turning to FIG. 9, FIG. 9 illustrates a single quad module 900 within its housing with its top cover removed. Shown are a complete assembled quad module 800 shown in FIG. 8, a hot housing 910, water coolant connections 930, 940 and a vacuum port 920. Not shown is a connection to a pneumatic control module.

Figure 10:
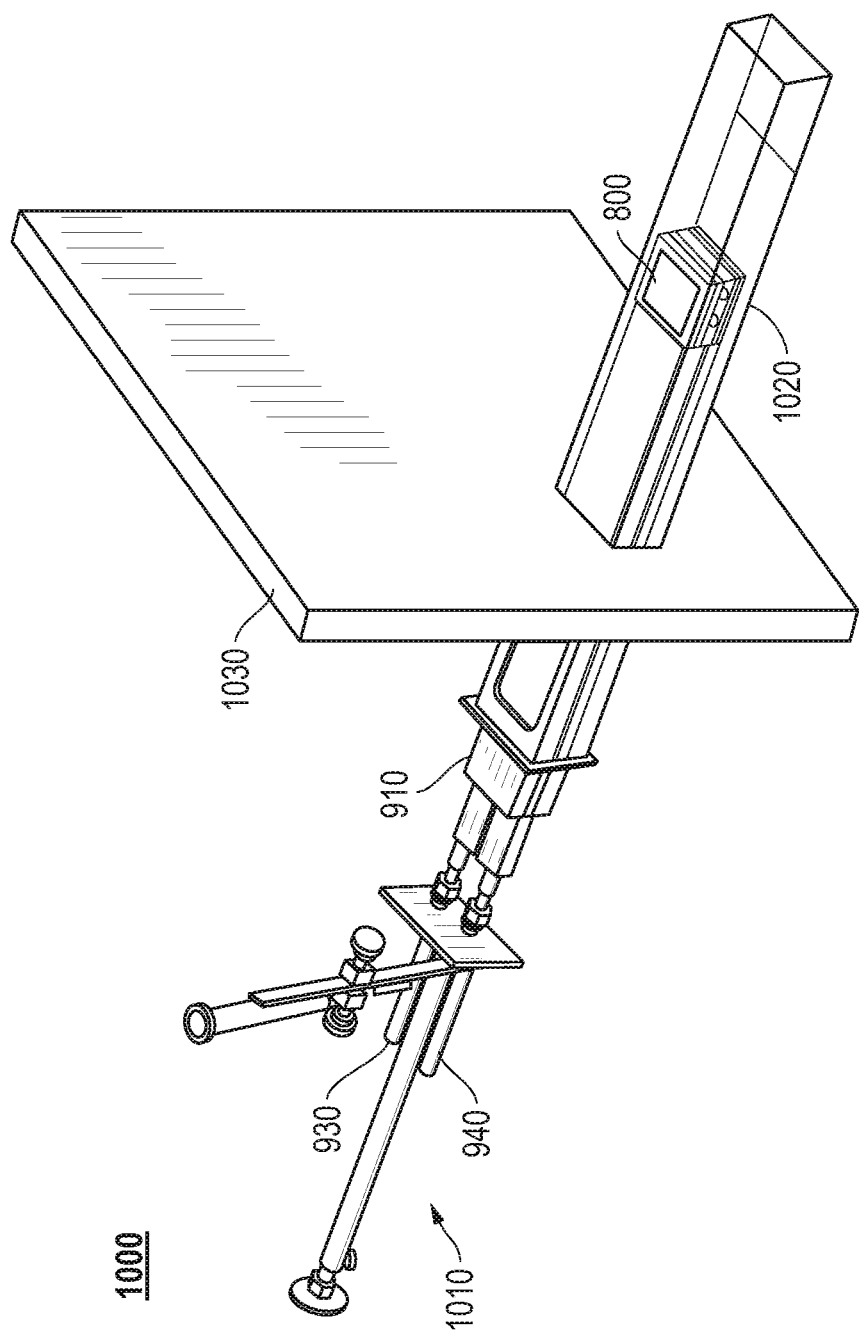
FIG. 10 illustrates a quad module sliding into its hot housing through a furnace wall.

Turning to FIG. 10, FIG. 10 illustrates a quad module sliding 1000 into its hot housing through a furnace wall. Shown are a quad module 800, hot housing 1020, furnace wall 1030, a quad module enclosure 910, water coolant connections 930, 940, and connections to electric power facilities, vacuum control module, and pneumatic control module 1010.

Figure 11:
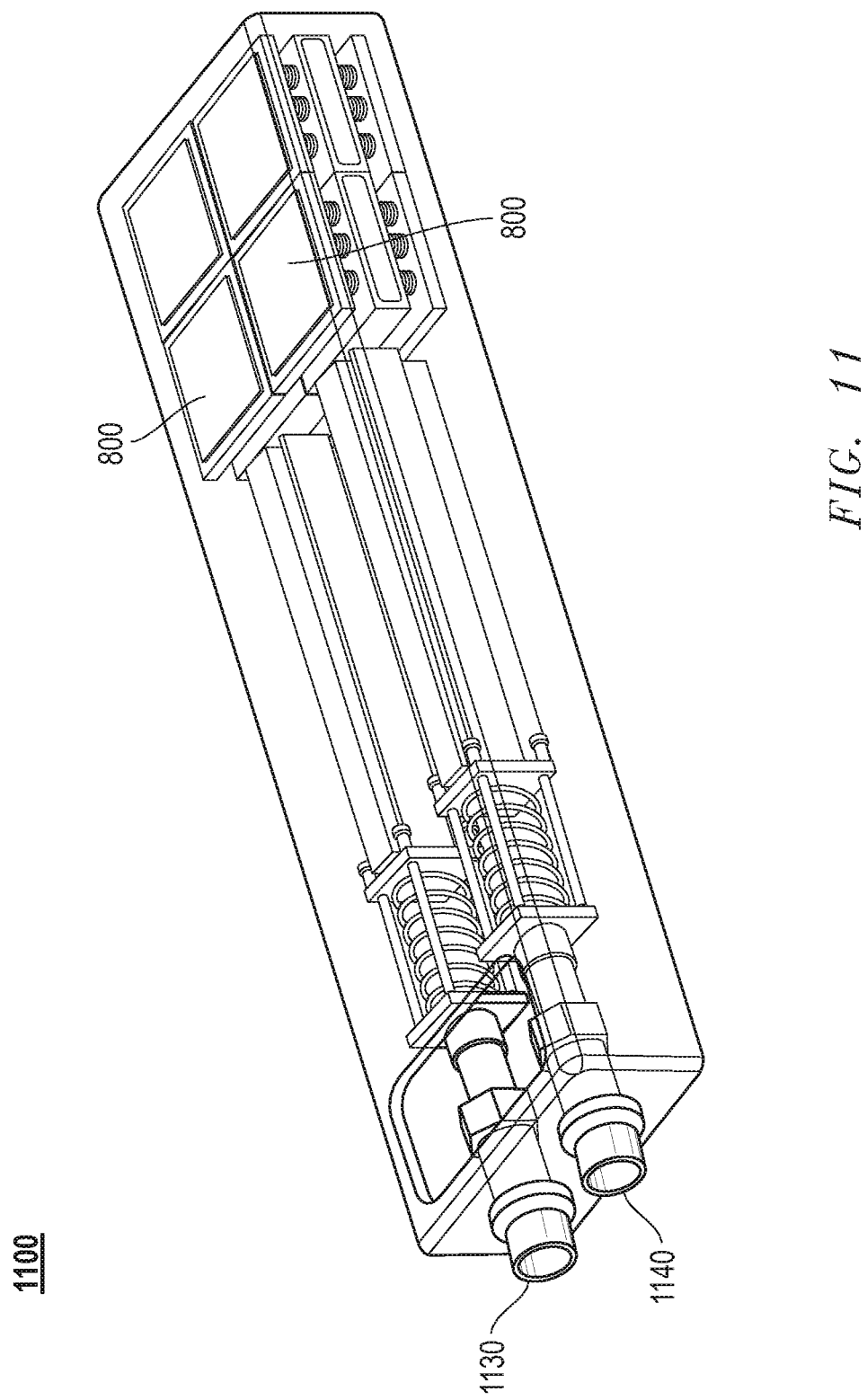
FIG. 11 shows a module containing four quad modules and coolant connection.

Turning to FIG. 11, FIG. 11 shows a module containing four quad modules and coolant connection 1100. It may include up to four double-sided quad modules 800 and coolant connections 1130, 1140.

Figure 12:
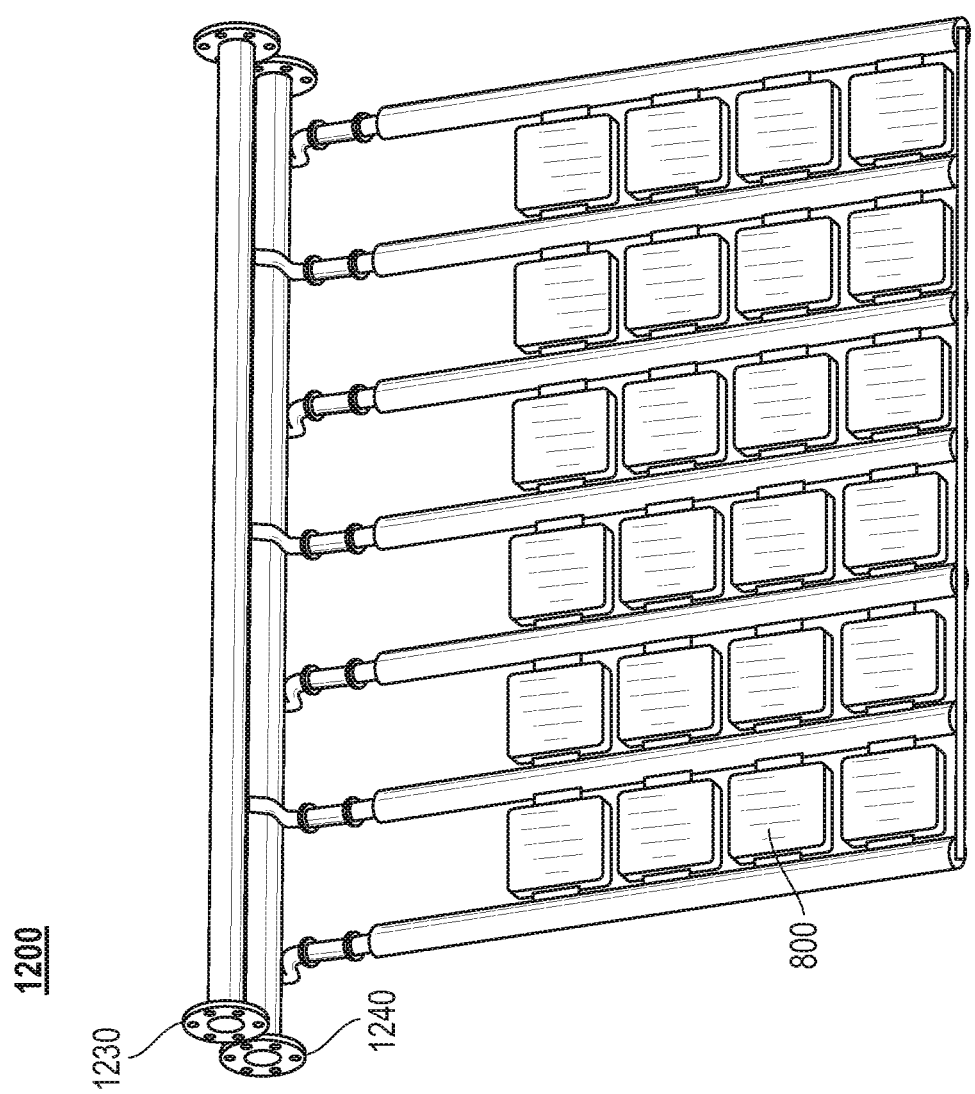
FIG. 12 shows an array of quad modules connected to common coolant lines.

Turning to FIG. 12, FIG. 12 shows an array of quad modules 1200 connected to common coolant lines. It shows 24 quad modules 800 connected to common coolant lines 1230, 1240. While each quad module contains arrays of photovoltaic cells and emitter chips, a panel may contain an M×N array of quad modules, where M and N are greater than or equal to one. Quad module arrays may be connected together by cooling pipes such that the units are cooled in series or parallel.

Figure 13:
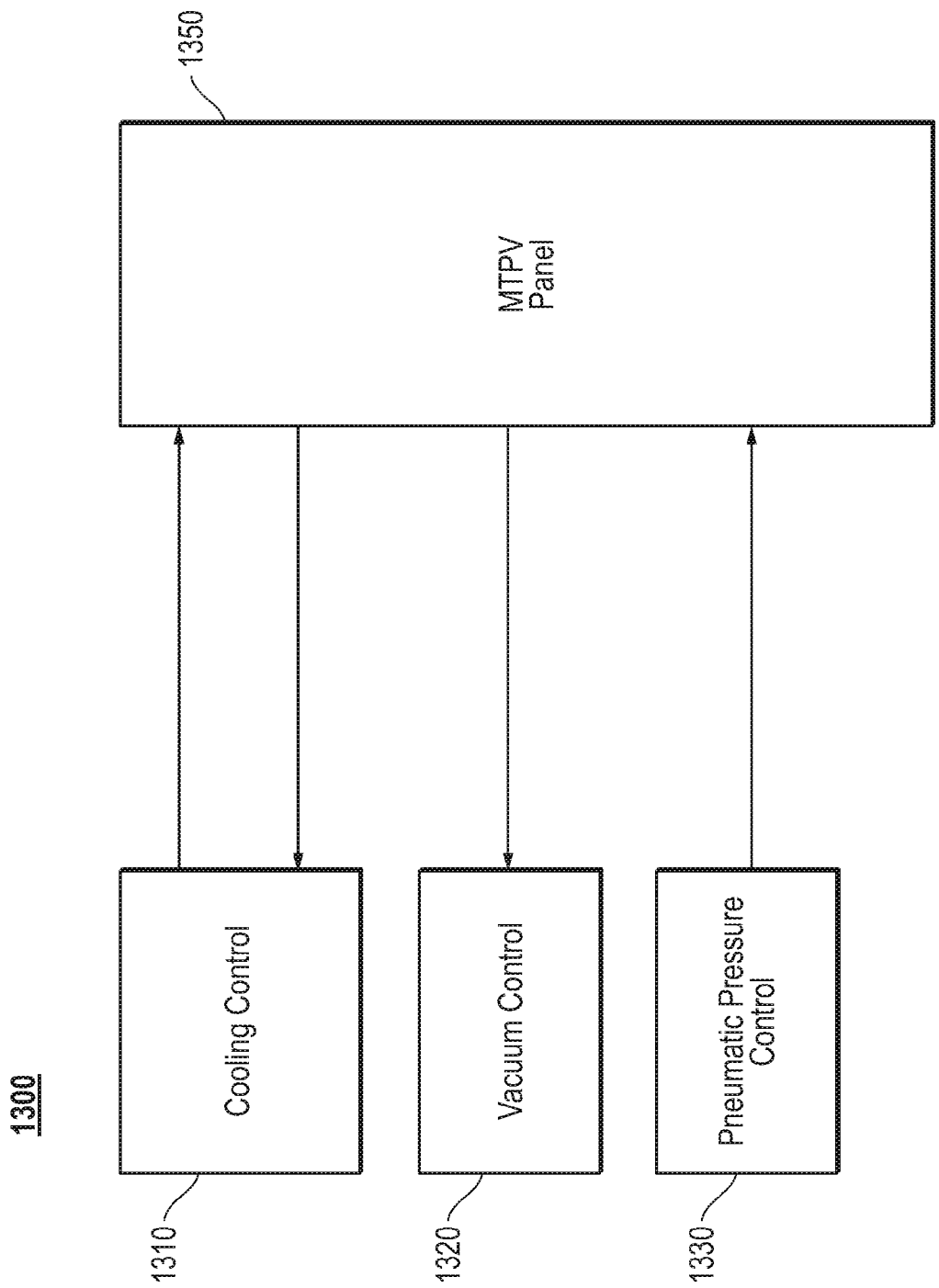
FIG. 13 shows required control modules connected to a MTPV panel comprising one or more quad modules.

Turning to FIG. 13, FIG. 13 shows required control modules connected to a MTPV panel comprising one or more quad modules 1300. Shown are a MPTV panel 1350, a cooling control module 1310, a vacuum control module 1320 and a pneumatic pressure control module 1330.

The invention claimed is:

1. A method for converting heat energy to electric power using sub-micron gap thermo photovoltaic technology, comprising the steps of:

collecting heat energy by a collecting surface (212) of a radiation-emitting layer (215) from an inner surface (208) of a thermally-conductive shell (210), an outer surface (205) of the thermally-conductive shell (210) being exposed to a heat energy source;

maintaining a receiving surface (222) of a photovoltaic cell (225) by spacers in a micro gap (220) less than one micron distance from an emitting surface (218) of the radiation-emitting layer (215);

receiving electromagnetic radiation by the receiving surface (222) from the emitting surface (218);

providing pressure on the photovoltaic cell (225) by a thermally conductive, deformable foil membrane (230) forming a wall of a pressurized chamber containing liquid metal (235) for keeping the collecting surface (212) of the radiation-emitting layer (215) in close contact with the inner surface (208) of the thermally-conductive shell (210) and for maximizing cooling of the photovoltaic cell (225);

providing pressure by a pneumatic chamber (260) maintained at a controlled pressure on a coolant chamber (245), a heat sink (240) in contact with the pressurized chamber containing liquid metal (235), the photovoltaic cell (225), the radiation-emitting layer (215), and the thermally-conductive shell (210) for further maximizing cooling of the photovoltaic cell (225); and circulating coolant liquid through cavities in the heat sink (240) and the coolant chamber (245) through use of flexible bellows and a coolant liquid distribution housing (270).

2. The method of claim 1, further comprising creating a vacuum between the emitting surface (218) of the radiation-emitting layer (215) and the receiving surface (222) of the photovoltaic cell (225) for minimizing heat conduction.

3. The method of claim 2, wherein the vacuum is less than $10^{-3}$ Torr.

4. The method of claim 1, further comprising maintaining a vacuum inside of the shell (205).

5. The method of claim 1 wherein the distance between the receiving surface (222) of the photovoltaic cell (225) and the emitting surface (218) of the radiation-emitting layer (215) is between 0.10 and 0.30 microns.

6. The method of claim 1, further comprising maintaining the distance between the receiving surface (222) of the photovoltaic cell (225) and the emitting surface (218) of the radiation-emitting layer (215) by use of thermally insulated spacers (220).

7. The method of claim 1, further comprising interposing a thermal interface between the collecting surface (212) of a radiation-emitting layer (215) and the inner surface (208) of the thermally-conductive shell (210).

8. The method of claim 7, wherein the thermal interface comprises thermally conductive graphite.

9. An apparatus for converting heat energy to electric power using sub-micron gap thermo photovoltaic technology, comprising:

a collecting surface (212) of a radiation-emitting layer (215) for collecting heat energy from an inner surface (208) of a thermally-conductive shell (210), an outer surface (205) of the thermally-conductive shell (210) being exposed to a heat energy source;

a receiving surface (222) of a photovoltaic cell (225) being maintained at less than one micron distance from an emitting surface (218) of the radiation-emitting layer (215) by spacers in a micro gap (220);

electromagnetic radiation being received by the receiving surface (222) from the emitting surface (218);

controlled pressure is applied to the photovoltaic cell (225) by a thermally conductive, deformable foil membrane (230) forming a wall of a pressurized liquid metal chamber containing liquid metal (235) for keeping the collecting surface (212) of the radiation-emitting layer (215) in close contact with the inner surface (208) of the thermally-conductive shell (210) and for maximizing cooling of the photovoltaic cell (225);

a pneumatic chamber (260) maintained at a controlled pressure on a coolant chamber (245), a heat sink (240) being in contact with the pressurized chamber containing liquid metal (235) for applying pressure on the photovoltaic cell (225), the radiation-emitting layer (215), and the thermally-conductive shell (210) for further maximizing cooling of the photovoltaic cell (225); and flexible bellows and a coolant liquid distribution housing (270) for circulating coolant liquid through cavities in the heat sink (240) and the coolant chamber (245).

10. The apparatus of claim 9, further comprising interposing a thermal interface between the collecting surface (212) of a radiation-emitting layer (215) and the inner surface (208) of the thermally-conductive shell (210).

11. The apparatus of claim 9, further comprising a thermal interface between a high-temperature housing (210) and a hot-side emitter (215) comprised of thermally conductive graphite.

12. The apparatus of claim 9, wherein a vacuum is maintained between the emitting surface (218) of the hot side emitter (215) and the receiving surface (222) of the cold side photovoltaic cell (225).

13. The apparatus of claim 9, wherein a vacuum is maintained within the shell (210).

14. The apparatus of claim 9, further comprising thermally insulated spacers (220) for maintaining the distance between the receiving surface (222) of the photovoltaic cell (225) and the emitting surface (218) of the radiation-emitting layer (215).

15. An apparatus for converting heat energy to electric power using sub-micron gap thermo photovoltaic technology, comprising a shell (910) for enclosing the components of a quad module (800), including:

an emitter chip array (420) maintained in close thermal contact with the shell (910) via a thermal interface (410);

a membrane (450) and photovoltaic subassembly (440, 710) spaced apart from the emitter chip array (420) by thermally insulated spacers (430);

a liquid metal chamber (460) in contact with the membrane (450) for maintaining the emitter chip array (420) in thermal contact with the shell (910);

a heat sink subassembly (470) for accepting a liquid coolant for cooling the membrane (450), the liquid metal chamber (460) and the photovoltaic subassembly (440, 710);

a water distribution housing (510, 740) for distributing the liquid coolant to a coolant input on the heat sink subassembly (470) via an input bellows subassembly (560, 570) and accepting the liquid coolant from a coolant output on the heat sink subassembly (470) via an output bellows subassembly (560, 570), the input bellows subassembly (560, 570) being positioned separately from the output bellows subassembly on the heat sink subassembly (470);

the bellows subassembly (560, 570) for enabling thermal expansion and contraction of the shell (910) and for forcing the heat sink subassembly (470) toward the shell (910);

a pneumatic subassembly (530, 540, 550) for maintaining the heat sink subassembly (470) in contact with the liquid metal chamber (460) and photovoltaic subassembly (440, 710); and a pressure regulator positioned separately from the pneumatic subassembly (530, 540, 550) for maintaining pressure in the pneumatic subassembly (530, 540, 550).

16. The apparatus of claim 15, wherein a vacuum is maintained within the shell (910).

17. The apparatus of claim 15, wherein the quad module (800) contains a multiplicity of photovoltaic cells (440, 710) and emitter chip arrays (420).

18. The apparatus of claim 15, wherein a shell (910) may comprise an M×N array of quad modules (800), where M and N are greater than or equal to one.

19. The apparatus of claim 15, further comprising a cooling control module (1310), a vacuum control module (1320) and a pneumatic pressure control module (1330).

\* \* \* \* \*